US010326259B2

United States Patent
Bellows et al.

(10) Patent No.: US 10,326,259 B2
(45) Date of Patent: Jun. 18, 2019

(54) ISOLATION AND EXHAUST SYSTEM FOR AN ELECTRICAL ENCLOSURE

(71) Applicant: Rockwell Automation Technologies, Inc., Mayfield Heights, OH (US)

(72) Inventors: Troy M. Bellows, Racine, WI (US); Piotr Badura, Sosnowiec (PL); Daniel Jastrzebski, Mikolów (PL); Maciej Lewandowski, Tychy (PL); Artur Wiertek, Bedzin (PL); Pawel Kokula, Dabrowa Gomicza (PL); Slawomir Styczen, Bedzin (PL)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/812,125

(22) Filed: Nov. 14, 2017

(65) Prior Publication Data

US 2019/0148921 A1 May 16, 2019

(51) Int. Cl.
*H05K 7/20* (2006.01)
*H02B 1/28* (2006.01)
*H02B 1/56* (2006.01)
*H05K 5/00* (2006.01)
*H05K 5/02* (2006.01)
*H02B 1/30* (2006.01)

(52) U.S. Cl.
CPC .......... *H02B 1/28* (2013.01); *H02B 1/30* (2013.01); *H02B 1/565* (2013.01); *H05K 5/0017* (2013.01); *H05K 5/0213* (2013.01)

(58) Field of Classification Search
None
See application file for complete search history.

(56) References Cited

U.S. PATENT DOCUMENTS 6,407,331 B1 * 6/2002 Smith ............... H02B 13/025
174/17 VA
7,778,013 B2 * 8/2010 Bruski .............. H05K 5/0213
361/605

(Continued)

FOREIGN PATENT DOCUMENTS

DE 102015122557 6/2017
JP 4879226 2/2012

OTHER PUBLICATIONS

Extanded European Search Report for Application 18205361.1 dated Feb. 25, 2019 (7 pages).

*Primary Examiner* — Courtney L Smith
(74) *Attorney, Agent, or Firm* — Boyle Fredrickson, S.C.

(57) ABSTRACT

An electrical enclosure, such as a Motor Control Centers (MCC), can include a ventilation system providing airflow while protecting from both ingress of solid objects as small as 1.0 millimeter and egress of gasses from an arc flash by providing a protective mesh with holes having a dimension of less than 1 millimeter, a bracket coupled to the mesh for providing a rigid support, and a flap configured to seal against the bracket and block the mesh in response to a pressure wave produced by an arc flash. The flap, normally open for airflow, can close in response to the pressure wave, by bending at a perforation line to move the flap toward the mesh. The electrical enclosure can also include a normally closed exhaust system. The exhaust system can be configured to open in response to the pressure wave to allow the gasses to escape.

12 Claims, 9 Drawing Sheets

(56) References Cited

U.S. PATENT DOCUMENTS

| | | | |
|---|---|---|---|
| 9,531,168 B2* | 12/2016 | Bugaris | H02B 13/025 |
| 9,608,415 B2* | 3/2017 | Cardin | H02B 1/565 |
| 2004/0114289 A1* | 6/2004 | Eiselt | H02B 13/025 |
| | | | 361/62 |
| 2005/0284167 A1* | 12/2005 | Morgan | B01D 5/009 |
| | | | 62/272 |
| 2009/0185333 A1* | 7/2009 | Coomer | H02B 13/025 |
| | | | 361/622 |
| 2012/0028559 A1* | 2/2012 | Kingston | H05K 5/0213 |
| | | | 454/184 |
| 2014/0133071 A1* | 5/2014 | Gingrich | H02B 1/565 |
| | | | 361/678 |
| 2015/0303661 A1* | 10/2015 | Farr | H02B 13/025 |
| | | | 218/157 |
| 2016/0042896 A1* | 2/2016 | Kingston | H01H 33/53 |
| | | | 218/157 |
| 2016/0294171 A1 | 10/2016 | Lafond et al. | |
| 2016/0295718 A1* | 10/2016 | Khzouz | H05K 5/0213 |
| 2017/0063052 A1 | 3/2017 | Johnson et al. | |

* cited by examiner

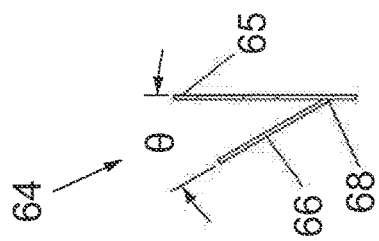
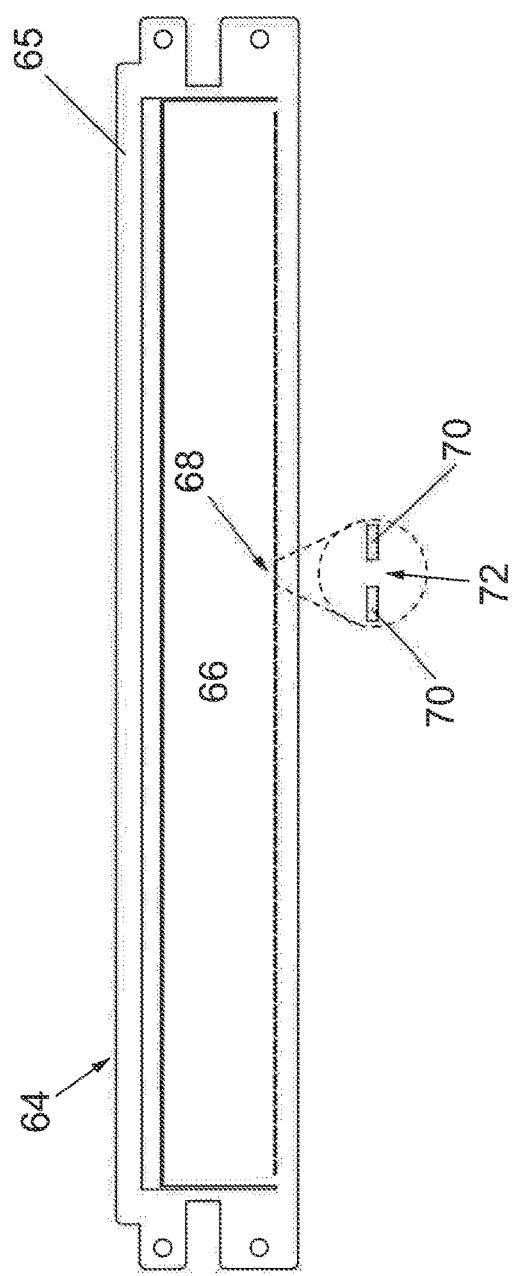
FIG. 5B
FIG. 5A

ISOLATION AND EXHAUST SYSTEM FOR AN ELECTRICAL ENCLOSURE

FIELD OF THE INVENTION

The present invention relates generally to electrical systems, and more particularly, to an isolation system for an electrical enclosures in which a flap is configured at an angle with respect to a support bracket to provide a gap between the flap and a mesh in a first state and is configured to close the gap and block the mesh in a second state by bending at a perforation line.

BACKGROUND OF THE INVENTION

Electrical systems with packaged electrical and electronic components are known and are in use. For example, Motor Control Centers (MCC's) are used for power and data distribution in large and industrial operations. In MCC's, a variety of components, such as switchgear, semiconductor power electronic circuits, programmable logic controllers, motor controllers, and so forth, are housed in large electrical enclosures that may be subdivided into sections or columns, which may be further subdivided into compartments. The MCC includes associated bus bars, interconnections and supporting structures for distribution of electrical power to the various compartments.

Typically, the MCC is connected to a main power line that may feed three-phase AC power to horizontal bus bars of the MCC. The horizontal bus bars, in turn, may feed the three-phase power to vertical bus bars disposed in each of the sections or columns of the MCC. The vertical bus bars, in turn, may feed the three-phase power to various electrical units (which typically include electrical components) that are installed in compartments of a section. The electrical units, in turn, may provide power terminals (conductors), such as copper bus bars, for feeding the three-phase power to a system environment, such as motors, as may be required for various applications.

It is often desirable to prevent such electrical units from reaching excessive temperatures as such temperatures for prolonged periods could result unpredictability and/or damage to the system. It is generally known to provide ventilation or airflow in electrical systems as a method for removing heat. Such ventilation can include an opening in the system for air to pass through to remove the heat. However, for MCC's, such openings may expose the system to possible damage from the environment, such as water intrusion, penetration of solid objects such as wires, and the like, and/or could expose the surrounding environment to the possibility of hazards such as arc flash or blast, a type of electrical discharge that could result from a low-impedance connection through air to ground or another voltage phase. Consequently, it is desirable to provide an improved system for ventilation protection which mitigates one or more of the foregoing disadvantages.

SUMMARY OF THE INVENTION

An electrical enclosure, such as a Motor Control Centers (MCC), can include a ventilation system providing airflow while protecting from both ingress of solid objects as small as 1.0 millimeter and egress of gasses from an arc flash by providing a protective mesh with holes having a dimension of less than 1 millimeter, a bracket coupled to the mesh for providing a rigid support, and a flap configured to seal against the bracket and block the mesh in response to a pressure wave produced by an arc flash. The flap, normally open for airflow, can close in response to the pressure wave, by bending at a perforation line to move the flap toward the mesh. The electrical enclosure can also include a normally closed exhaust system. The exhaust system can be configured to open in response to the pressure wave to allow the gasses to escape.

In one aspect, a ventilated enclosure providing ingress protection with respect to very small objects, on the order of 1.0 millimeter, can be provided using a mesh material. Hoods can be employed on top plate, back plate, and drip hood on front top horizontal wire way cover to provide additional protection against ingress of water. For manufacturing, a stainless steel mesh can be spot welded between two steel plates. The mesh can have a maximum opening of 1.0 millimeter, which can meet International Electro Technical Commission Ingress Protection (IP) requirements up to IP-4X (protection against solid objects over 1.0 millimeter, e.g. wires,), when also painted with powder paint coating, and up to IK7 impact protection (protection against a 500 gram object dropped from 40 centimeters). Aluminum flaps can be used to seal a ventilated enclosure under arc fault conditions. Pressure from an arc flash can causes the flaps to close to contain arc fault energy. Other aspects can include systems and/or methods for ventilating and/or isolating electrical equipment as described in U.S. Pat. No. 9,609,769, which is incorporated herein by reference, and which is assigned to the assignee of the present application.

Specifically then, one aspect of the present invention can provide an isolation system for an electrical enclosure, including: a mesh having multiple holes; a support bracket coupled to the mesh; and an isolation assembly coupled to the support bracket, the isolation assembly including a flap and a perforation line, the perforation line including multiple slits in which each slit is separated from another slit by a separation distance, in which the flap is configured at an angle with respect to the support bracket to provide a gap between the flap and the mesh in a first state, and in which the flap is configured to close the gap and block the mesh in a second state by bending at the perforation line to move the flap toward the mesh.

Another aspect of the present invention can provide an electrical enclosure including: a shell for supporting an electrical unit; first and second isolation systems attached to first and second openings in the enclosure, respectively, each isolation system including: a mesh having multiple holes; a support bracket coupled to the mesh; and an isolation assembly coupled to the support bracket, the isolation assembly including a flap and a perforation line, the perforation line including multiple slits in which each slit is separated from another slit by a separation distance, in which the flap is configured at an angle with respect to the support bracket to provide a gap between the flap and the mesh in a first state, in which the flap is configured to close the gap and block the mesh in a second state by bending at the perforation line to move the flap toward the mesh, and in which, in the first state, the first isolation system attached to the first opening is configured to provide an ingress airflow and the second isolation system attached to the second opening is configured to provide an egress airflow.

Yet another aspect of the present invention can provide a Motor Control Center (MCC) including: a section forming a shell around a device mounting volume for supporting multiple electrical units; first and second isolation systems attached to first and second openings in the section, respectively, each isolation system including: a mesh having multiple holes; a support bracket coupled to the mesh; and an isolation assembly coupled to the support bracket, the isolation assembly including a flap and a perforation line, the perforation line including multiple slits in which each slit is separated from another slit by a separation distance, in which the flap is configured at an angle with respect to the support bracket to provide a gap between the flap and the mesh in a first state, in which the flap is configured to close the gap and block the mesh in a second state by bending at the perforation line to move the flap toward the mesh, and in which, in the first state, the first isolation system attached to the first opening is configured to provide an ingress airflow and the second isolation system attached to the second opening is configured to provide an egress airflow.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which:

FIG. 5A is a detailed plan view of an isolation assembly of the of isolation system of FIG. 4, and FIG. 5B is detailed side view of the isolation assembly of FIG. 5A;

DETAILED DESCRIPTION OF THE OF THE INVENTION

Figure 1:
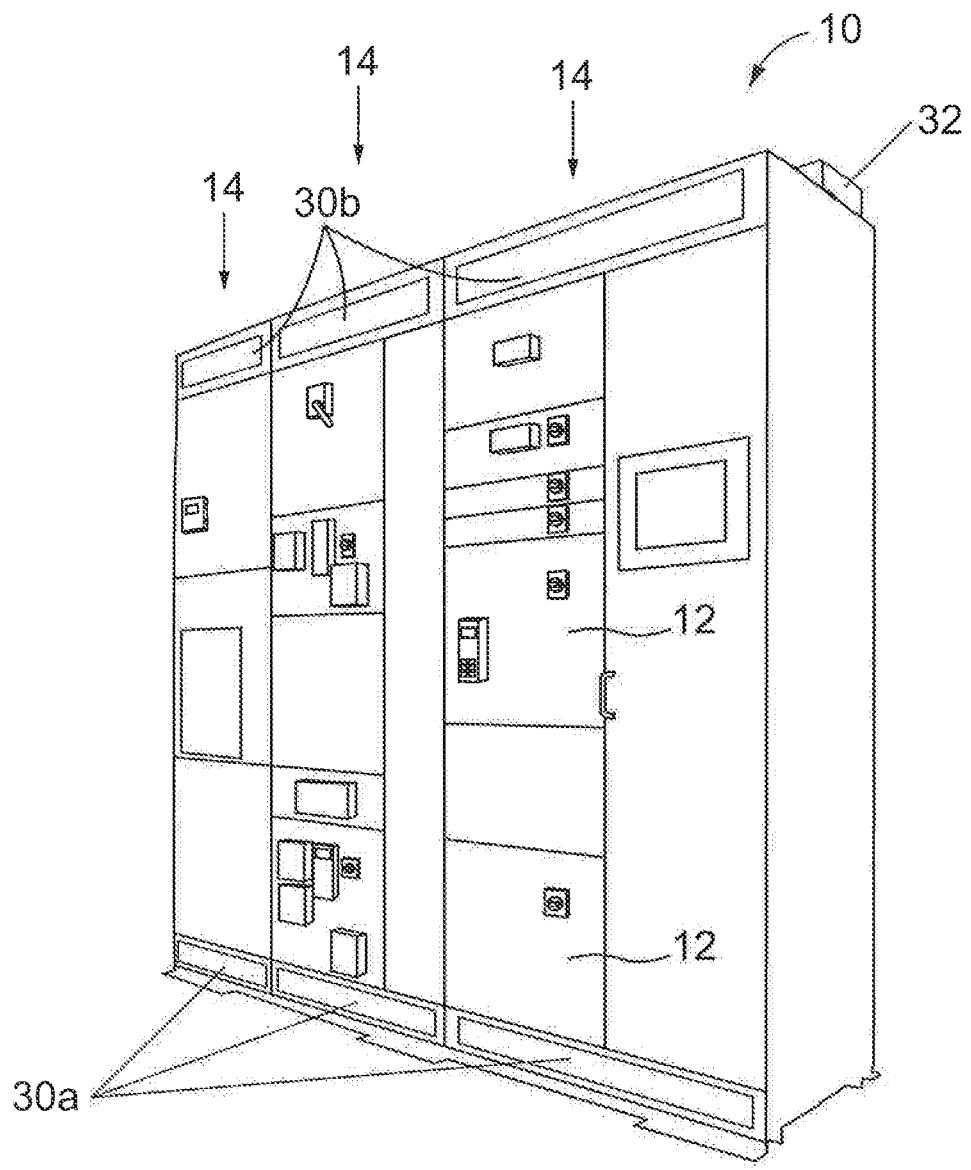
FIG. 1 is an isometric view of an exemplar electrical system which could be a Motor Control Center (MCC) in which electrical units of various types may be housed in accordance with an aspect of the invention.

Referring now to FIG. 1, an exemplar electrical system 10 is provided in which multiple electrical units 12 of various types may be housed. The electrical system 10 may be, for example, a Motor Control Center (MCC) or other industrial, commercial, marine, or other electrical system. In general, the electrical system 10 may provide an enclosure, such as sections 14, each forming a shell around a device mounting volume for supporting the units 12. The shell may be made of any suitable material, such as heavy gage sheet metal, reinforced plastics, and so forth. The electrical system 10 may typically receive three-phase electrical power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses.

It should be appreciated that the units 12 may be provided with varying configurations to achieve various purposes in the electrical system 10. In general, each unit 12 can include a door for covering an assembly of components that are housed and supported within an interior volume of the unit. The units 12, in turn, can be mounted in the sections 14 via known methods, such as screwed ("fixed feed" or "frame mounted") or snap-in ("withdrawable") engagement via load stabs 20 that are in communication with the interior volume, thereby providing mechanical and electrical connection to the electrical system 10. Exemplary components of the units can include relays, motor starters, and Programmable Logic Controllers (PLC's), among others. Doors for the units 12 may also include, for example, a lever (such as a rotary lever to turn ON and OFF a Circuit Breaker inside the unit and enabling opening of the door when the Circuit Breaker is OFF), a lock for preventing the door from opening, one or more lights for indicating a safe condition for opening the door, and/or a user interface for monitoring and controlling aspects of the unit 12.

In accordance with an aspect of the invention, to provide ventilation for cooling components of the units 12, while also protecting from ingress of solid objects as small as 1.0 millimeter and egress of gasses from an arc flash, the sections 14 can each include isolation systems 30 and exhaust systems 32 attached to openings in the sections. In one aspect, the isolation systems 30 can include first isolation systems 30a, attached to openings arranged at lower portions of the sections 14, and second isolation systems 30b, attached to openings arranged at upper portions of the sections 14. The first and second isolation systems 30a and 30b, respectively, are preferably on a common or first side of the sections 14, such as a front of the electrical system 10, to facilitate efficient airflows for cooling the system while positioned against adjacent sections 14 on either side, a wall to its back, and/or other structures.

Figure 2:
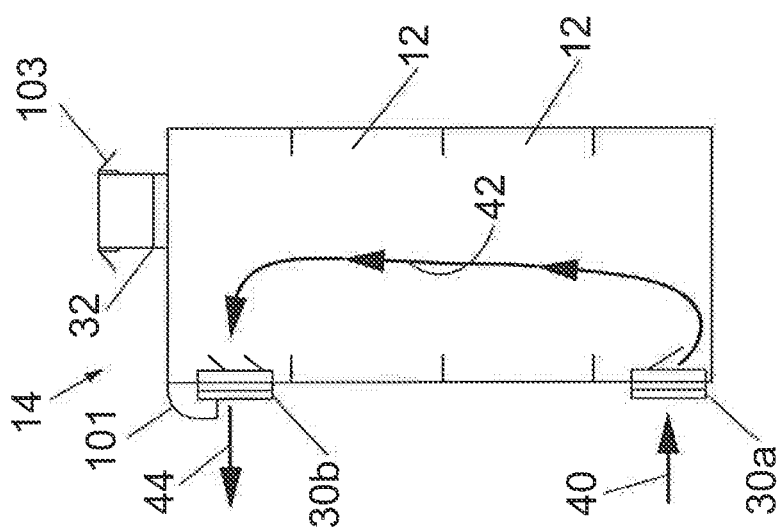
FIG. 2 is a diagrammatic side view of a section of the MCC of FIG. 1 in a first state in which airflows ingress and egress through openings for cooling the electrical system.

With additional reference to FIG. 2, a diagrammatic side view of a section 14 in a first state shows how airflows can enter and exit the section 14 through the isolation systems 30 attached to openings to provide ventilation. For example, an ingress airflow 40, which may be fresh ambient air, can enter a section 14 through a first isolation system 30a attached to a first opening at a lower portion of the section 14. The ingress airflow 40, in turn, supplies an interior airflow 42 rising in the section 14 to cool components vertically arranged in the units 12. The heat produced by such components causes the interior airflow 42 to rise, which continues to draw the ingress airflow 40 into the section 14. Then, an egress airflow 44, supplied by the interior airflow 42, exits the section 14 through a second isolation system 30b attached to a second opening at the upper portion of the section 14.

Figure 3:
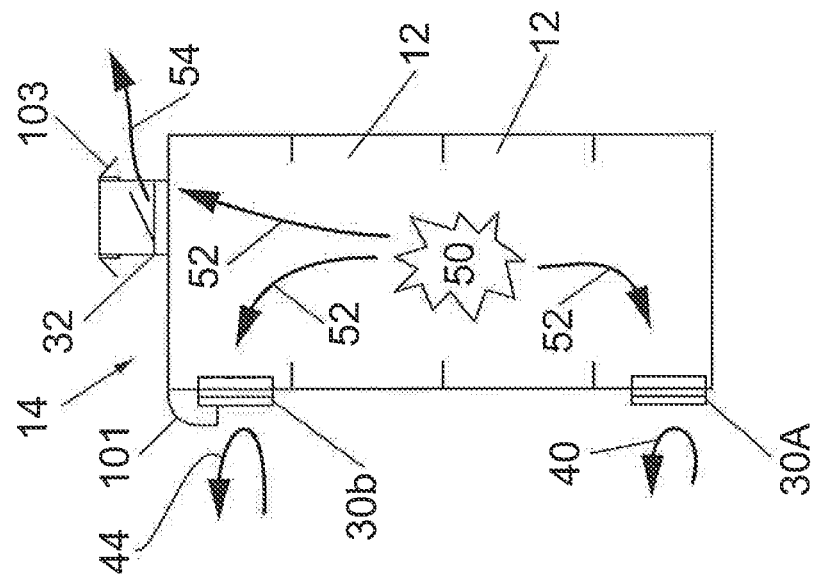
FIG. 3 is a diagrammatic side view of the section of FIG. 2 in a second state in which an arc flash causes isolation systems attached to the openings to close and an exhaust system to open.

However, with additional reference to FIG. 3, in a second state, an arc flash 50 in the section 14 can produce a pressure wave 52 sufficient to cause the first and second isolation systems 30*a* and 30*b*, respectively, to close. An arc flash or blast is a type of electrical discharge that could result from a low-impedance connection through air to ground or another voltage phase. Such arcing faults are known to create heat, gases, melted metal, shrapnel, and/or other debris which may be ejected by the affected electrical system. By configuring the first and second isolation systems 30*a* and 30*b*, respectively, to close in response to the pressure wave 52 in the second state, such gases, shrapnel and the like can be contained within the section 14, thereby lessening the possibility of exposure to people or objects that may be proximal to the section 14. When the first and second isolation systems 30*a* and 30*b*, respectively, close, the ingress and egress airflows 40 and 44, respectively, are cut off, and fresh ambient air is redirected external to the section 14.

In addition, in the second state, the pressure wave 52 from the arc flash 50 is sufficient to cause the exhaust system 32 to open. In particular, the pressure wave 52 can cause the exhaust system 32, which is normally closed in the first state, to open nearly simultaneously with closure of the first and second isolation systems 30*a* and 30*b*, respectively, in the second state. By opening the exhaust system 32 in the second state, the aforementioned gases resulting from the arc flash 50, and any trapped portion of the interior airflow 42, can be vented away from people or objects that may be proximal to the section 14 in an arc flash vent flow 54 at a top portion of the section 14, preferable toward the back of the section 14. Each of the sections 14 in the electrical system 10 can implement the first and second isolation systems 30*a* and 30*b*, respectively, and/or the exhaust system 32, separately or in combination, in this way.

Figure 4:
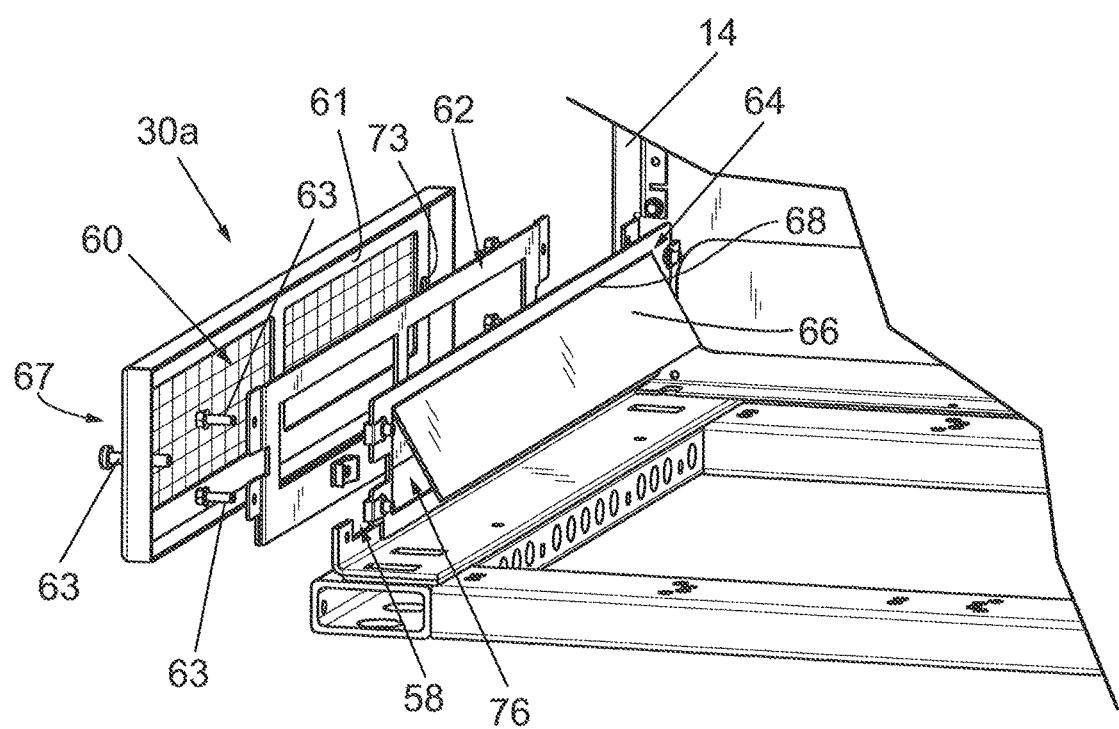
FIG. 4 is an exploded view of an isolation system of FIG. 1 from within a section of the MCC in a first aspect.

Referring now to FIG. 4, in a one aspect, as shown from within a section 14 of the electrical system 10 in an exploded view, the first isolation system 30*a* can be attached to a first opening 58 at the lower portion of the section 14. The first isolation system 30*a* can include a mesh 60 having multiple holes, a support bracket 62 coupled to the mesh, and an isolation assembly 64 coupled to the support bracket 62. The mesh 60, the support bracket 62 and the isolation assembly 64 can be attached to one another with a plurality of fasteners 63, which could be bolts, screws, rivets or other fasteners, passing through apertures in one or more of the mesh 60, the support bracket 62 and the isolation assembly 64.

The isolation assembly 64 can include an isolation frame 65 having a plurality of apertures and defining a flap 66, cut on three sides from isolation frame 65, and a perforation line 68 on a fourth side of the flap 66. With additional reference to FIG. 5A, including a detailed view of a portion of the perforation line 68, the perforation line can include multiple slits 70. To provide desired bending in response to the pressure wave 52, each slit 70 can be separated from another slit 70 by a separation distance 72. A length of each slit 70, measured in a direction along the perforation line 68, is preferably greater than the separation distance 72. Also, the length of each slit 70 is preferably greater than a thickness of the flap 66. In one aspect, the length of each slit 70 could be about 1.5 millimeters, the separation distance 72 could be about 6.4 millimeters, and the thickness of the flap 66 could be about 2.0 millimeters. The perforation line 68 weakens the isolation assembly 64 in an area of the perforation line 68 to allow bending at the perforation line 68 to move the flap 66 toward the mesh 60 in response to the pressure wave 52. The isolation assembly 64 could be constructed from metal, such as aluminum.

With additional reference to FIG. 5B, a detailed side view of the isolation assembly 64, the flap 66 is configured at an angle θ with respect to the isolation frame 65, which is parallel with and coupled to the support bracket 62, and which is parallel with and coupled to the mesh 60. The angle θ is preferably angled inwardly and downwardly (see also FIG. 2) at angle, such as 30°, with respect to the section 14. As a result, the angle θ provides a gap 76 (FIG. 4) between the flap 66 and the mesh 60 in the first state, which is a manufactured state.

Figure 6:
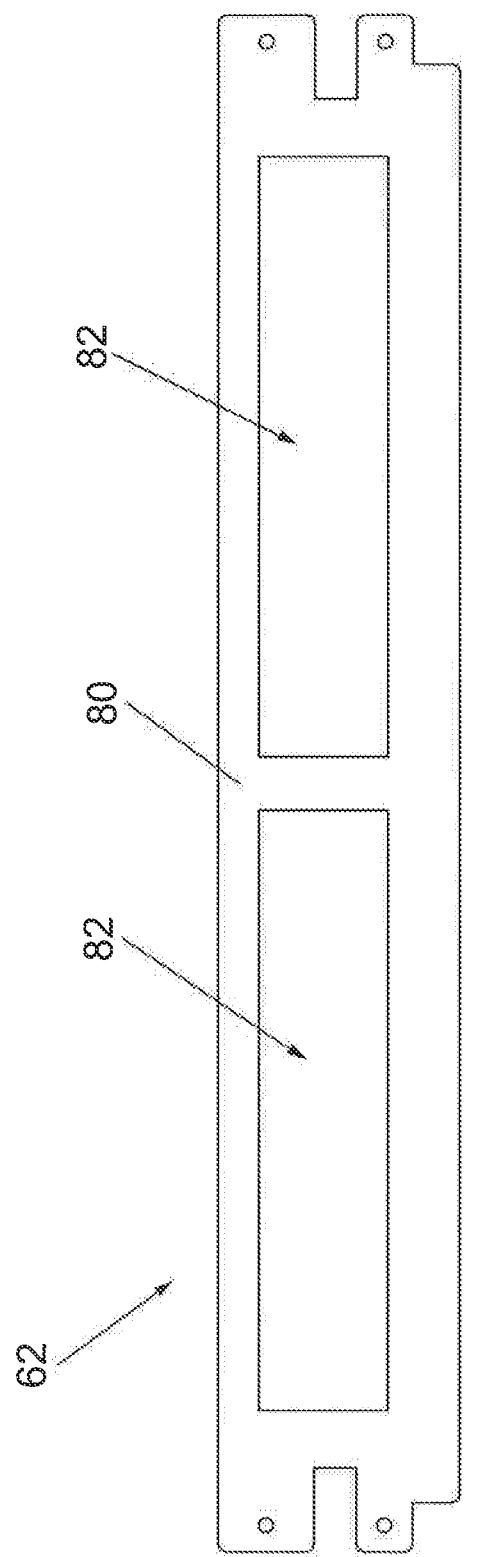
FIG. 6 is detailed plan view of a support bracket of the of isolation system of FIG. 4.

With additional reference FIG. 6, the support bracket 62 can include a support frame 80 defining one or more support openings 82 cut into the support frame 80. The support bracket 62, coupled to the mesh 60, provides a rigid support for the mesh 60. This allows the mesh 60 to provide holes that are relatively small in construction, on the order of 1.0 millimeter or less, up to achieve IP-4X (protection against solid objects over 1.0 millimeter, e.g. wires,), when the mesh 60 is also painted with powder paint coating, and up to IK7 impact protection (protection against a 500 gram object dropped from 40 centimeters). Accordingly, in the second state, which is a deformed state, in response to the pressure wave 52 produced by an arc flash, the flap 66 closes the gap 76 to seal against the support frame 80 of the support bracket 62 and block the support openings 82 and, in turn, the mesh 60 coupled to the support frame 80 of the support bracket 62. Once deformed, the isolation assembly 64 can be replaced.

As described above, the mesh 60 can prevent solid objects from passing through the opening while still allowing ventilation. The mesh 60 could comprise a barrier made of connected strands of steel, metal, fiber or other flexible or ductile materials which can be arranged in a grid analogous to web or net to provide multiple holes that is welded between plates 61, each having plate openings, in a mesh assembly 67. The plates 61 can be metal and can include apertures 73 for receiving fasteners 63. In one aspect, the mesh 60 can be configured to have hole dimensions of 1.0 millimeter or less to prevent solid objects that are 1.0 millimeter or greater, such as wires, from passing through. In addition, the mesh 60 can include a powder paint coating of about 0.1 millimeter thickness on the entire surface of the mesh. Accordingly, the powder paint can further reduce the hole dimensions by about 0.1 millimeter.

Figure 7:
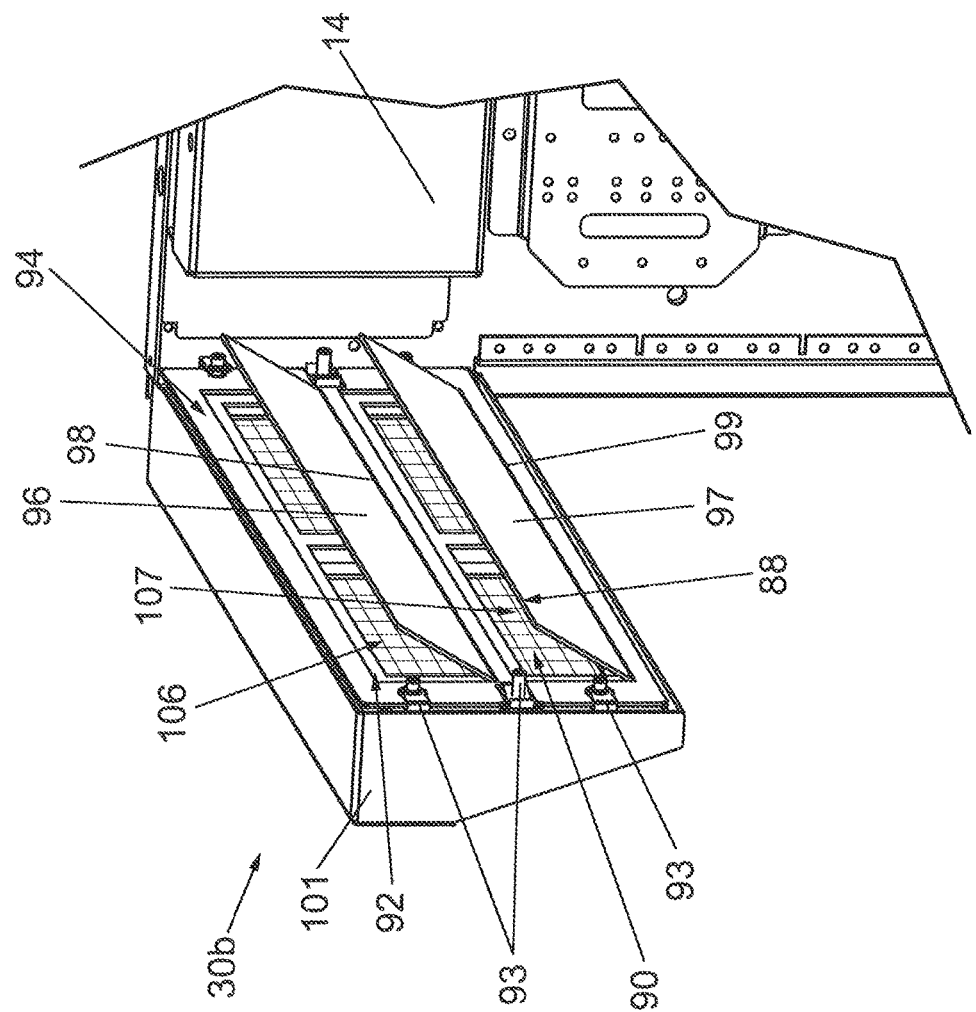
FIG. 7 is an exploded view of an isolation system of FIG. 1 from within a section of the MCC in a second aspect.

Referring now to FIG. 7, in another aspect, as shown from within a section 14 of the electrical system 10 in an assembled view, the second isolation system 30*b* can be attached to a second opening 88 at the upper portion of the section 14. The second isolation system 30*b* can include a mesh 90 having multiple holes, a support bracket 92 coupled to the mesh, and an isolation assembly 94 coupled to the support bracket 92. The mesh 90, the support bracket 92 and the isolation assembly 94 can be attached to one another with a plurality of fasteners 93, which could be bolts, screws, rivets or other fasteners, passing through apertures in one or more of the mesh 90, the support bracket 92 and the isolation assembly 94. The second isolation system 30, being attached to an opening at an upper portion of the section 14, can also include a hood 101 (FIGS. 2, 3 and 7) to prevent ingress of liquid such as water.

The isolation assembly 94 can include an isolation frame 95 having a plurality of apertures and defining first and second flaps 96 and 97, respectively, each cut on three sides from isolation frame 95, and first and second perforations line 98 and 99, respectively, on fourth sides of the first and second perforations line 98 and 99, respectively. With additional reference to FIG. 8A, like the perforation line 68, the first and second perforations line 98 and 99, respectively, can include multiple slits. To provide desired bending in response to the pressure wave 52, each slit can be separated from another slit by a separation distance. A length of each slit, measured in a direction along the perforation line, is preferably greater than the separation distance. Also, the length of each slit is preferably greater than a thickness of the first and second flaps 96 and 97, respectively. In one aspect, the length of each slit could be about 1.5 millimeters, the separation distance 72 could be about 6.4 millimeters, and the thickness of the first and second flaps 96 and 97, respectively, could be about 2.0 millimeters. The first and second flaps 96 and 97, respectively, weakens the isolation assembly 94 in areas of the perforations to allow bending at the perforations to move the first and second flaps 96 and 97, respectively, toward the mesh 90 in response to the pressure wave 52. The isolation assembly 94 could be constructed from metal, such as aluminum.

Figure 8B:
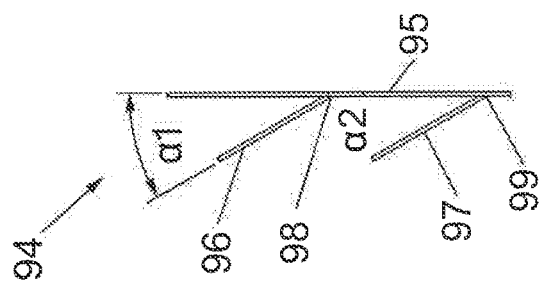
FIG. 8B is detailed side view of the isolation assembly of FIG. 8A.
Figure 8A:
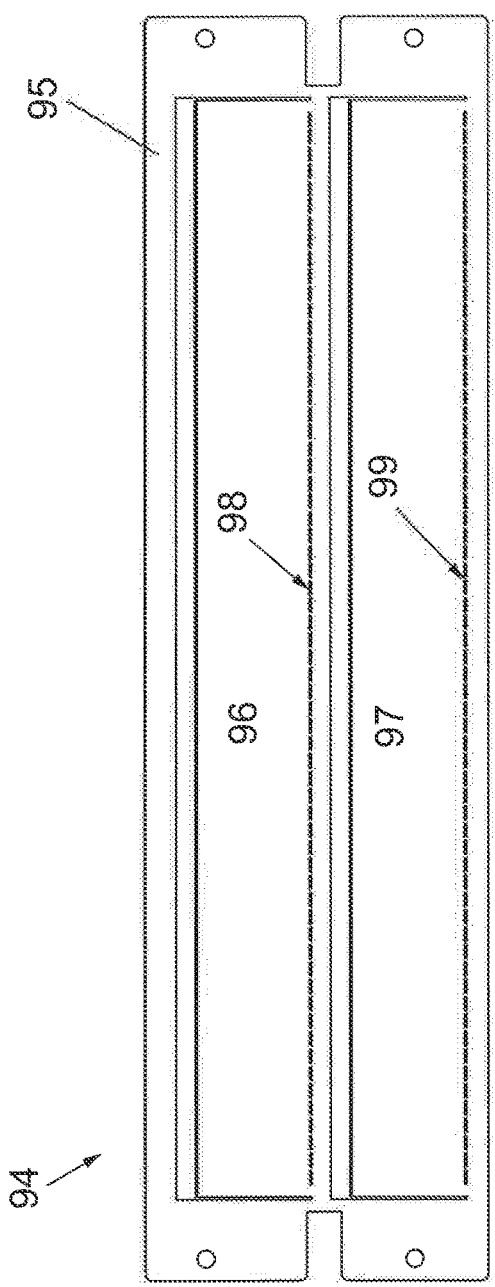
FIG. 8A is detailed plan view of an isolation assembly of the of isolation system of FIG. 7.

With additional reference to FIG. 8B, a detailed side view of the isolation assembly 94, the first and second flaps 96 and 97, respectively, are configured at first and second angles α1 and α1, respectively, with respect to the isolation frame 95, which is parallel with and coupled to the support bracket 92, and which is parallel with and coupled to the mesh 90. The first and second angles α1 and α1, respectively, are each preferably angled inwardly and upwardly (see also FIG. 2), at a same angle, such as 30°, with respect to the section 14. As a result, the first and second angles α1 and α1, respectively, provide first and second gaps 106 and 107, respectively, (FIG. 7) between the first and second flaps 96 and 97, respectively, and the mesh 90 in the first state, which is a manufactured state. By providing multiple flaps on the second isolation systems 30b, the ventilation system effectively provides redundancy.

Figure 9:
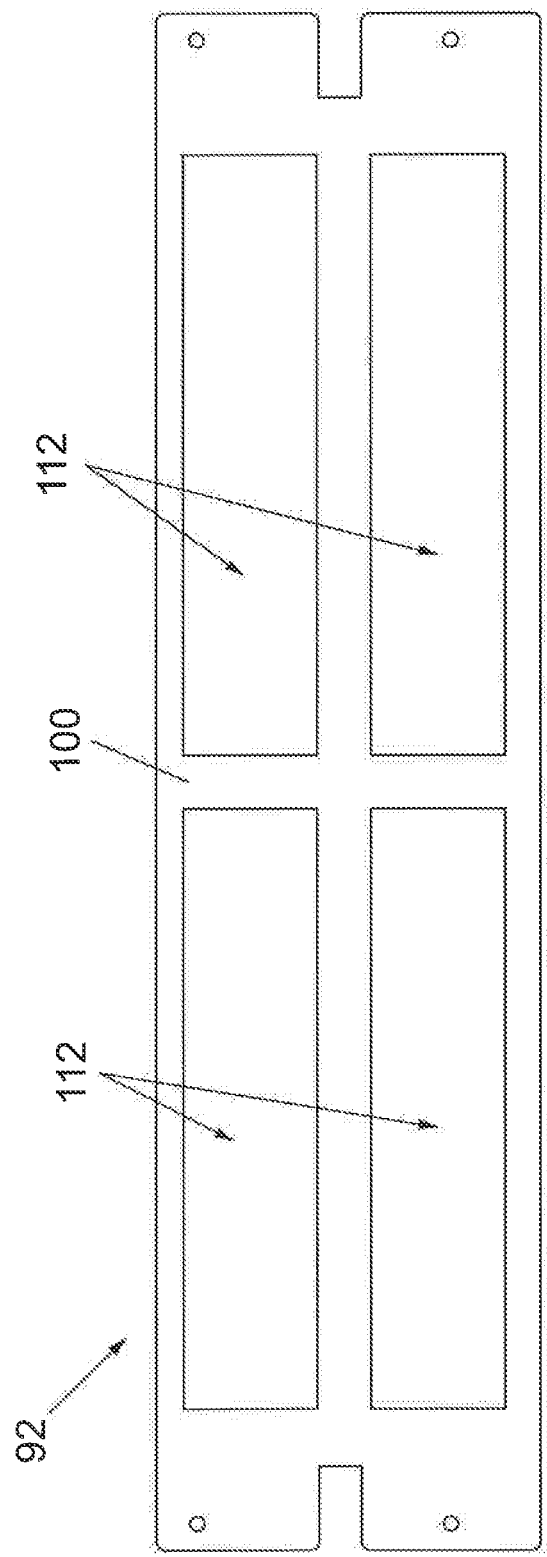
FIG. 9 is detailed plan view of a support bracket of the of isolation system of FIG. 7.

With additional reference FIG. 9, the support bracket 92 can include a support frame 110 defining one or more support openings 112 cut into the support frame 100. The support bracket 92, like the support bracket 62, couples to the mesh 90 and provides a rigid support for the mesh 90. This allows the mesh 90, like the mesh 60, to provide holes that are relatively small in construction, on the order of 1.0 millimeter or less, up to achieve IP-4X (protection against solid objects over 1.0 millimeter, e.g. wires,), when the mesh 60 is also painted with powder paint coating, and up to IK7 impact protection (protection against a 500 gram object dropped from 40 centimeters). Accordingly, in the second state, which is a deformed state, in response to the pressure wave 52 produced by an arc flash, the first and second flaps 96 and 97, respectively, close the first and second gaps 106 and 107, respectively, to seal against the support frame 110 of the support bracket 92 and block the support openings 112 and, in turn, the mesh 90 coupled to the support frame 110 of the support bracket 92. Once deformed, the isolation assembly 94 can be replaced.

It should be appreciated that either the first or second isolation systems 30a or 30b, respectively, and/or variations thereof, could be used in a single enclosure system, attached to various openings, as desired. Moreover, multiple instances of the same type of isolation system 30 could be used in any such system. Such variations are within the scope of the invention.

Figure 10:
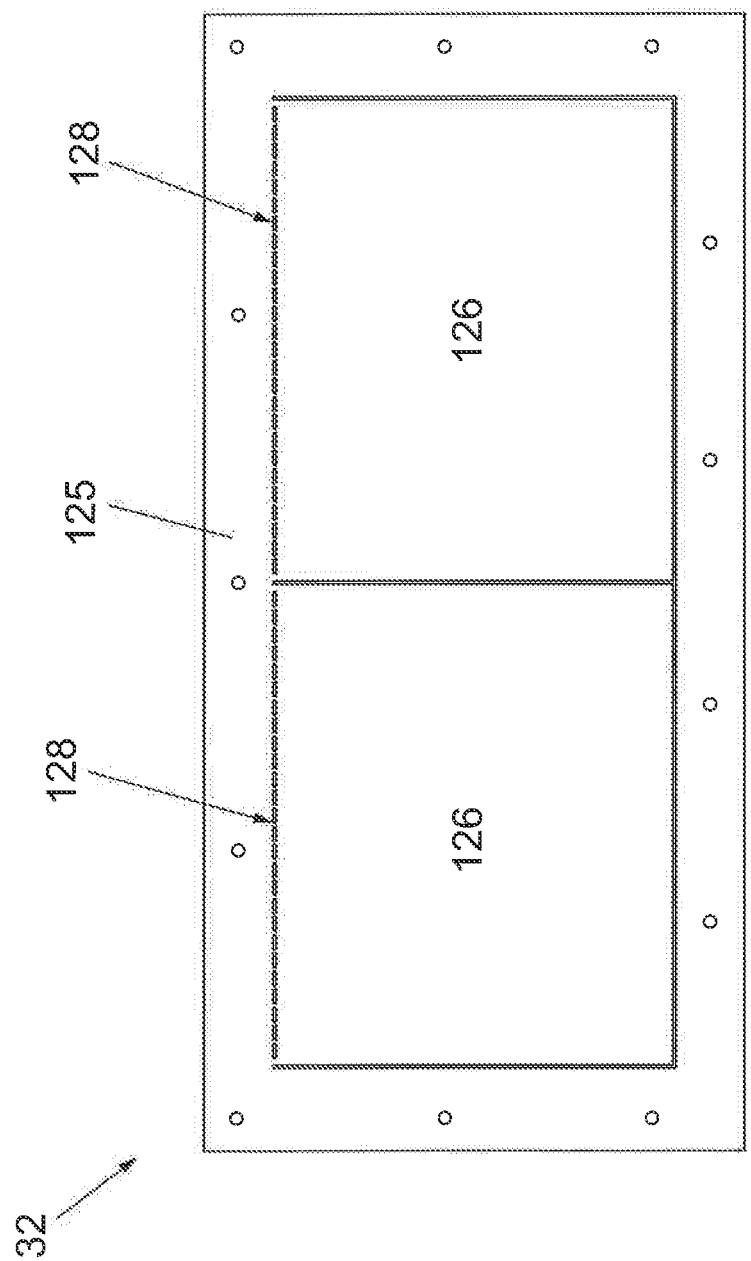
FIG. 10 is detailed plan view of an exhaust system of the of isolation system of FIG. 1.

Referring now to FIG. 10, in another aspect, as shown in a detailed plan view, the exhaust system 32 can be attached to a third opening at top portion of the section 14, preferable toward the back of the section 14. The exhaust system 32 can include an exhaust frame 125 having a plurality of apertures and defining one or more flaps 126 cut into the exhaust frame 125, and one or more perforation lines 128 on fourth sides of the one or more flaps 126. Like the perforation line 68, each slit of the perforation line 128 can be separated from another slit by a separation distance; a length of each slit, measured in a direction along the perforation line 128, can preferably be greater than the separation distance; and the length of each slit can preferably be greater than a thickness of the flap 126. The flap 126 is configured to be closed in the first state, which is a manufactured state, to block the third opening. However, in response to the pressure wave 52 produced by an arc flash, the flap 126 is configured to open at an angle φ with respect to the third opening, such as 30°, to provide a gap in the second state, which is a deformed state, to allow gasses to escape. Once deformed, the exhaust system 32 can be replaced. The exhaust system 32 could be constructed from metal, such as aluminum. The exhaust system 32, being attached to an opening at a top portion of the section 14, can also include a hood 103 (FIGS. 2 and 3) to prevent ingress of liquid such as water.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as coming within the scope of the following claims. All of the publications described herein including patents and non-patent publications are hereby incorporated herein by reference in their entireties.

What is claimed is:
1. An electrical enclosure comprising:
a shell for supporting an electrical unit;
first and second isolation systems attached to first and second openings in the enclosure, respectively, each isolation system comprising:
a mesh having a plurality of holes;
a support bracket coupled to the mesh; and
an isolation assembly coupled to the support bracket, the isolation assembly comprising a flap and a perforation line, the perforation line comprising a plurality of slits in which each slit is separated from another slit by a separation distance, wherein the flap is configured at an angle with respect to the support bracket to provide a gap between the flap and the mesh in a first state, wherein the flap is configured to close the gap and block the mesh in a second state by bending at the perforation line to move the flap toward the mesh, and wherein, in the first state, the first isolation system attached to the first opening is configured to provide an ingress airflow and the second isolation system attached to the second opening is configured to provide an egress airflow, and further comprising an exhaust system attached to a third opening in the shell, the exhaust system comprising a flap and a perforation line, the perforation line comprising a plurality of slits in which each slit is separated from another slit by a separation distance, wherein the flap is configured to be closed in the first state to block the third opening, and wherein the flap is configured open at an angle with respect to the third opening to provide a gap in the second state.

2. The electrical enclosure of claim 1, wherein the first isolation system is arranged at a lower portion of the enclosure on a first side, the second isolation system is arranged at an upper portion of the enclosure on the first side, and the exhaust system is arranged at a top portion of the enclosure.

3. The electrical enclosure of claim 2, wherein the first and second isolation systems and the exhaust system are each configured to transition from the first state to the second state following an arc flash producing a pressure wave in the enclosure.

4. The electrical enclosure of claim 1, wherein, for the first and second isolation systems, the flap is angled inwardly with respect to the enclosure in the first state, and wherein, for the exhaust system, the flap is angled outwardly with respect to the enclosure in the second state.

5. The electrical enclosure of claim 1, wherein the flap and the perforation line of the first isolation system are a first flap and a first perforation line, respectively, and wherein the first isolation system further comprises a second flap and a second perforation line, wherein the first and second flaps of the first isolation system are configured at a same angle in the first state.

6. The electrical enclosure of claim 1, wherein, for the first and second isolation systems, a length of each slit of is greater than the separation distance, and wherein the length of each slit is greater than a thickness of the flap.

7. A Motor Control Center (MCC) comprising:
a section forming a shell around a device mounting volume for supporting a plurality of electrical units;
first and second isolation systems attached to first and second openings in the section, respectively, each isolation system comprising:
a mesh having a plurality of holes;
a support bracket coupled to the mesh; and
an isolation assembly coupled to the support bracket, the isolation assembly comprising a flap and a perforation line, the perforation line comprising a plurality of slits in which each slit is separated from another slit by a separation distance, wherein the flap is configured at an angle with respect to the support bracket to provide a gap between the flap and the mesh in a first state, wherein the flap is configured to close the gap and block the mesh in a second state by bending at the perforation line to move the flap toward the mesh, and wherein, in the first state, the first isolation system attached to the first opening is configured to provide an ingress airflow and the second isolation system attached to the second opening is configured to provide an egress airflow, and further comprising an exhaust system attached to a third opening in the shell, the exhaust system comprising a flap and a perforation line, the perforation line comprising a plurality of slits in which each slit is separated from another slit by a separation distance, wherein the flap is configured to be closed in the first state to block the third opening, and wherein the flap is configured open at an angle with respect to the third opening to provide a gap in the second state.

8. The MCC of claim 7, wherein the first isolation system is arranged at a lower portion of the section on a first side, the second isolation system is arranged at an upper portion of the section on the first side, and the exhaust system is arranged at a top portion of the section.

9. The MCC of claim 8, wherein the first and second isolation systems and the exhaust system are each configured to transition from the first state to the second state following an arc flash producing a pressure wave in the section.

10. The MCC of claim 7, wherein, for the first and second isolation systems, the flap is angled inwardly with respect to the section in the first state, and wherein, for the exhaust system, the flap is angled outwardly with respect to the section in the second state.

11. The MCC of claim 7, wherein the flap and the perforation line of the first isolation system are a first flap and a first perforation line, respectively, and wherein the first isolation system further comprises a second flap and a second perforation line, wherein the first and second flaps of the first isolation system are configured at a same angle in the first state.

12. The MCC of claim 7, wherein for the first and second isolation systems a length of each slit of is greater than the separation distance, and wherein the length of each slit is greater than a thickness of the flap.

* * * * *